(12) United States Patent
Seo et al.

(10) Patent No.: US 10,890,853 B1
(45) Date of Patent: Jan. 12, 2021

(54) EXPOSURE DEVICE

(71) Applicant: Samsung Display Co., LTD., Yongin-si (KR)

(72) Inventors: Kab Jong Seo, Yongin-si (KR); Min Suk Ko, Yongin-si (KR); Si Kwang Kim, Yongin-si (KR); Yong Hoon Yang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/883,277

(22) Filed: May 26, 2020

(30) Foreign Application Priority Data

Jul. 29, 2019 (KR) .......................... 10-2019-0091966

(51) Int. Cl.
*G03F 7/09* (2006.01)
*G03F 7/20* (2006.01)

(52) U.S. Cl.
CPC ............ *G03F 7/70858* (2013.01); *G03F 7/09* (2013.01)

(58) Field of Classification Search
CPC .... G03F 7/70858; G03F 7/20; G03F 7/70341; G03F 7/09
USPC ..................................................... 355/30, 53
See application file for complete search history.

(56) References Cited

U.S. PATENT DOCUMENTS

| | | | |
|---|---|---|---|
| 6,297,871 B1 | 10/2001 | Hagiwara | |
| 6,922,910 B2 | 8/2005 | Tsuji et al. | |
| 2005/0002005 A1* | 1/2005 | Terada | ................. G03F 7/70733 355/53 |
| 2012/0170009 A1* | 7/2012 | Katsura | .............. B01D 53/0415 355/30 |
| 2013/0247937 A1* | 9/2013 | Nunomura | ........ H01L 21/67109 134/18 |

FOREIGN PATENT DOCUMENTS

| | | |
|---|---|---|
| JP | 4085813 | 5/2008 |
| JP | 2008-203556 | 9/2008 |
| JP | 4789352 | 10/2011 |
| KR | 10-0498893 | 9/2005 |

* cited by examiner

*Primary Examiner* — Hung Nguyen
(74) *Attorney, Agent, or Firm* — Kile Park Reed & Houtteman PLLC

(57) ABSTRACT

An exposure device may include an exposure head that may radiate an exposure beam onto a substrate on a stage, a support that may be provided on the stage to support the exposure head, a chamber that may accommodate the stage, the exposure head, and the support. The exposure device may include first protrusions that may be disposed on an outer circumference of the support adjacent to an inner wall of the chamber, and second protrusions that may be disposed on the inner wall of the chamber surrounding the outer circumference of the support. The first and second protrusions may overlap each other in a plan view.

18 Claims, 8 Drawing Sheets

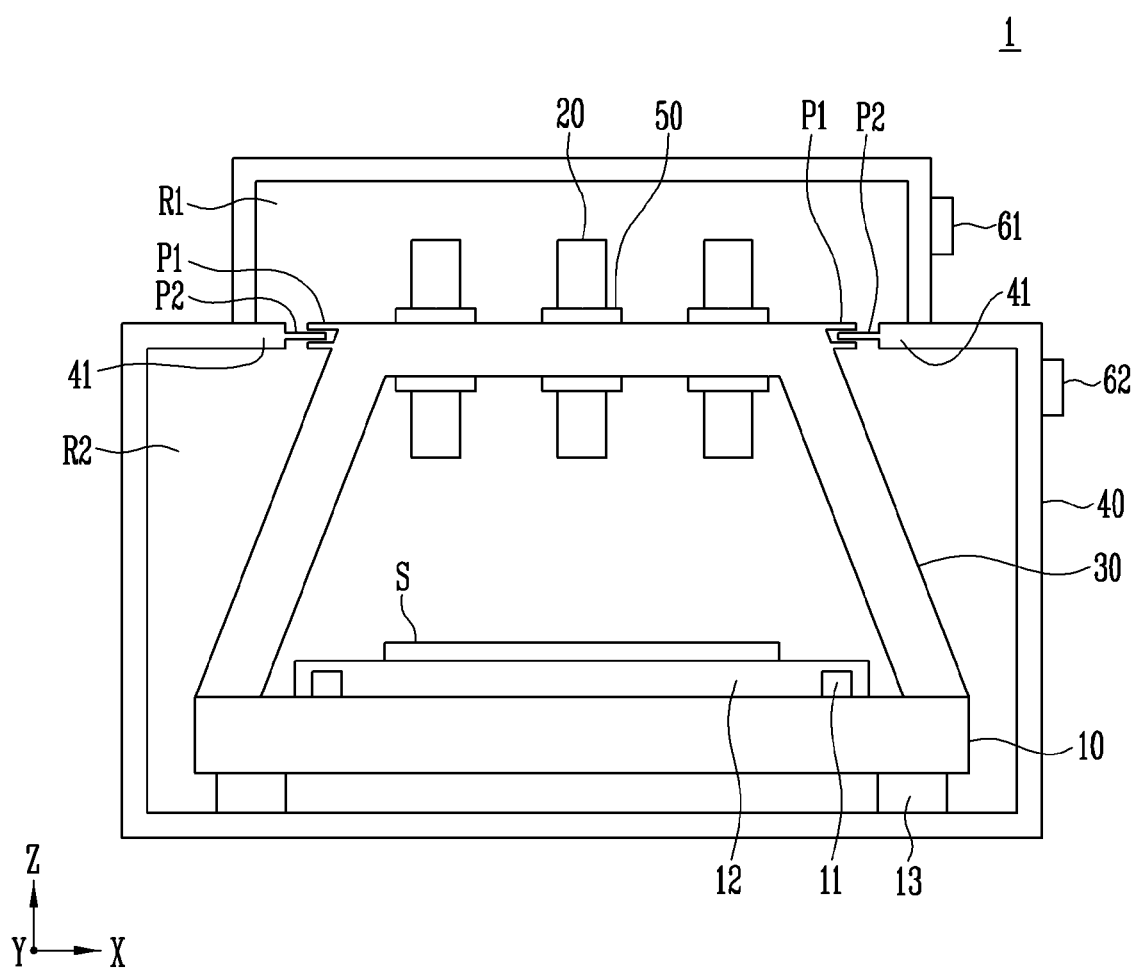

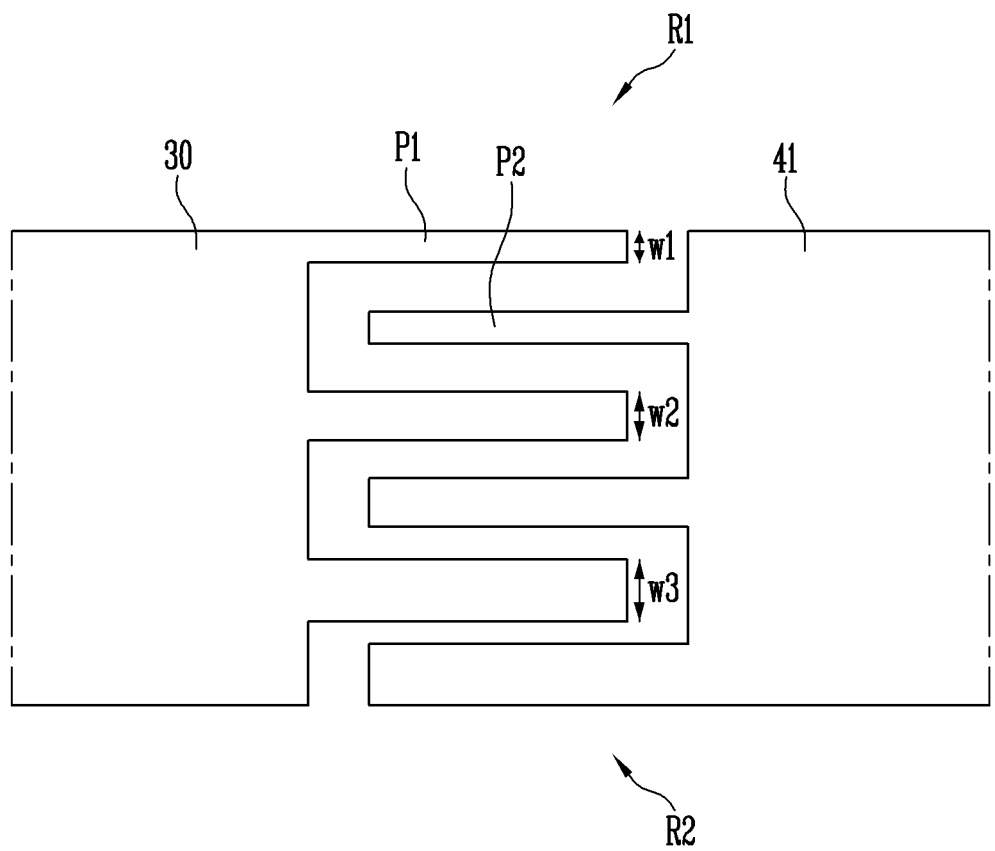

EXPOSURE DEVICE

CROSS-REFERENCE TO RELATED APPLICATION

This application claims priority to and benefits of Korean Patent Application No. 10-2019-0091966 under 35 U.S.C. § 119, filed in the Korean Intellectual Property Office on Jul. 29, 2019, the entire contents of which are incorporated herein by reference.

BACKGROUND

Technical Field

Various embodiments of the disclosure relates to an exposure device.

Description of the Related Art

Generally, a method of forming a pattern on a substrate that may form a liquid crystal display (LCD), a plasma display panel (PDP), a flat panel display (FPD), or the like, may be performed as follows: A pattern material may first be applied to the substrate and the pattern material may be selectively exposed using a photomask to selectively remove a pattern material portion having changed chemical properties or other portions, thus forming the pattern.

However, as the substrate may gradually become larger and the pattern may become more precise, a digital exposure device that may form the pattern on the substrate without using the photomask may be desirable. A digital exposure device may form the pattern by transferring an optical beam to the substrate with pattern information made of an electric signal using an electronic device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments of the disclosure are directed to an exposure device, which may be capable of effectively suppressing the heat generation of an exposure head and stably forming a pattern on a substrate.

An embodiment of the disclosure may provide an exposure device, including an exposure head that may radiate an exposure beam onto a substrate on a stage of the exposure device, and a support that may be provided on the stage to support the exposure head. The exposure device may include a chamber that may accommodate the stage, the exposure head, and the support. The exposure device may include first protrusions that may be disposed on an outer circumference of the support adjacent to an inner wall of the chamber; and second protrusions that may be disposed on the inner wall of the chamber surrounding the outer circumference of the support. The first and second protrusions may be disposed to overlap each other in a plan view.

In an embodiment, the first and second protrusions may be arranged alternately with each other and spaced apart from each other.

In an embodiment, the chamber may include a first space in which a part of the exposure head may be accommodated, and a second space in which the stage may be accommodated.

In an embodiment, the exposure device may further include a partition wall provided between the first space and the second space and protruding from the inner wall of the chamber, wherein the partition wall may be spaced apart from the support.

In an embodiment, the second protrusions may be provided on a surface of the partition wall facing the support.

In an embodiment, the exposure device may further include a first air conditioner that may supply first air to the first space of the chamber from outside the chamber, and a second air conditioner that may supply second air to the second space of the chamber from outside the chamber.

In an embodiment, a flow rate of the first air supplied to the first space of the chamber may be greater than a flow rate of the second air supplied to the second space of the chamber.

In an embodiment, spacing distances between the first protrusions and the second protrusions may be equal to each other in a direction from the first space towards the second space.

In an embodiment, spacing distances between the first protrusions and the second protrusions may be reduced in a direction from the first space towards the second space.

In an embodiment, spacing distances between the first protrusions and the second protrusions may be reduced by a multiplier of about 0.7 to about 0.9 in a direction from the first space towards the second space.

In an embodiment, a spacing distance between the first protrusions and a spacing distance between the second protrusions may be reduced by a multiplier of about 0.7 to about 0.9 in a direction from the first space towards the second space.

In an embodiment, lengths of the first protrusions and the second protrusions may increase in a direction from the first space towards the second space.

In an embodiment, lengths of the first protrusions and the second protrusions may gradually increase by a multiplier of about 1.1 to about 1.3 in a direction from the first space towards the second space.

In an embodiment, widths of the first protrusions and the second protrusions may increase in a direction from the first space towards the second space.

In an embodiment, the exposure head may include a light source that may emit an exposure beam, a light modulator that may modulate the exposure beam according to an exposure pattern, and a projection optical system that may transmit the modulated exposure beam to the substrate in a form of a beam spot array.

An embodiment of the disclosure may provide an exposure device, including a chamber including a first space and a second space, and an exposure head that may radiate an exposure beam onto a substrate. The exposure head may be at least partially disposed in the first space. The exposure device may include a stage disposed in the second space to seat the substrate. The exposure device may include a support disposed in the chamber to support the exposure head, first protrusions disposed on an outer side of the support, and second protrusions disposed on an inner side of the chamber. The first and second protrusions may be disposed to overlap each other in a plan view.

In an embodiment, the first protrusions and the second protrusions may be arranged alternately with each other.

In an embodiment, the exposure device may include a partition wall between the first space and the second space. The partition wall may protrude from the inner side of the chamber. The second protrusions may be disposed on a surface of the partition wall.

BRIEF DESCRIPTION OF THE DRAWINGS

FIG. 1A is a front schematic sectional view of an exposure device in accordance with an embodiment.

FIG. 8 is a schematic sectional view illustrating first protrusions and second protrusions in accordance with another embodiment.

DETAILED DESCRIPTION OF THE EMBODIMENTS

Figure 1B:
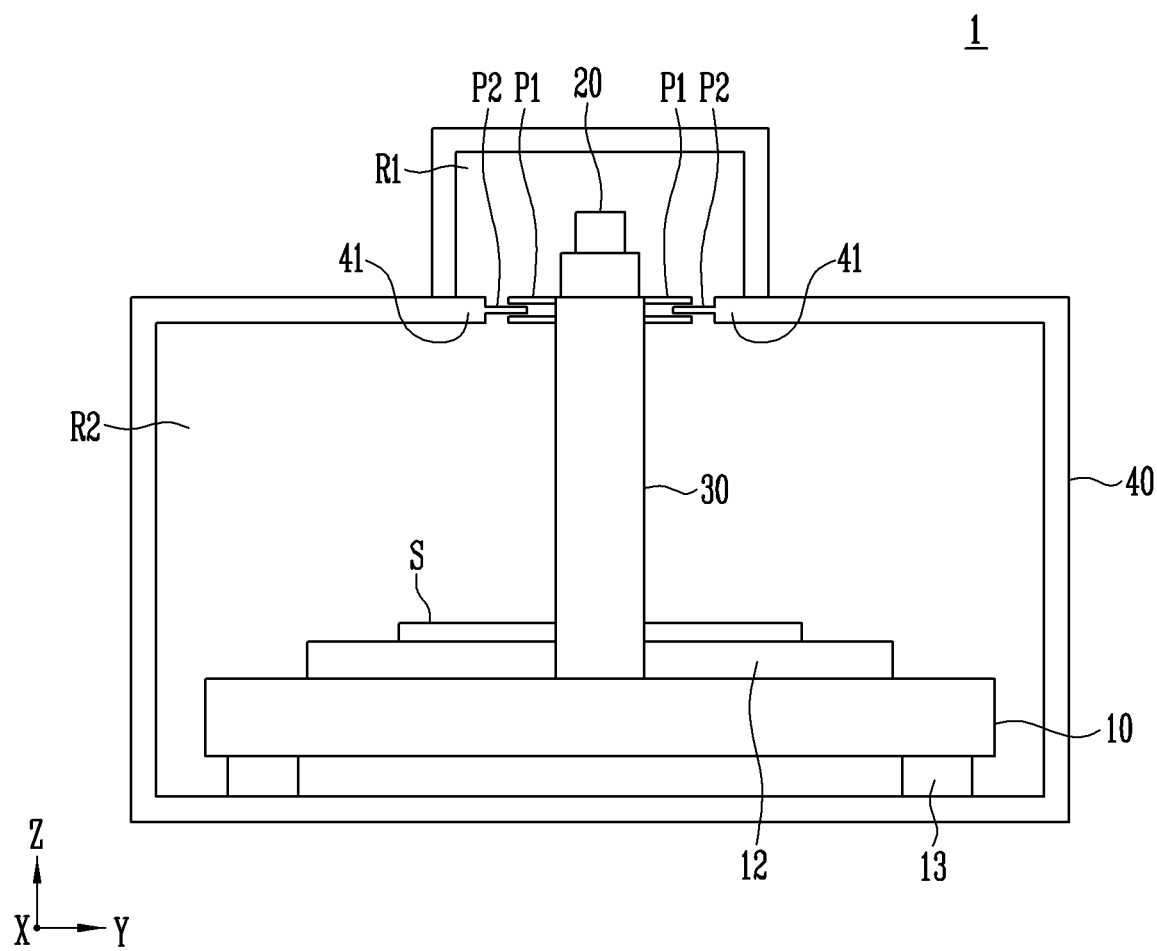
FIG. 1B is a side schematic sectional view of the exposure device.

As the disclosure allows for various changes and numerous embodiments, particular embodiments will be illustrated in the drawings and described in detail. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes and thicknesses of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise, "include", "have", etc. as used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed "on" a second part, the first part may be not only directly on the second part but a third part may intervene between them. In case that it is expressed that a first part such as a layer, a film, a region, or a plate is formed "on" a second part, the surface of the second part on which the first part is formed is not limited to an upper surface of the second part but may include other surfaces such as a side surface or a lower surface of the second part. In case that a first part such as a layer, a film, a region, or a plate is "under" a second part, the first part may be not only directly under the second part but a third part may intervene between them.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Respective features of embodiments of the present disclosure may be partially or entirely joined or combined with each other, and technically various linkages and driving may be possible. The embodiments may be implemented independently or in association or combination with each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Embodiments will hereinafter be described in detail with reference to the accompanying drawings.

Figure 1C:
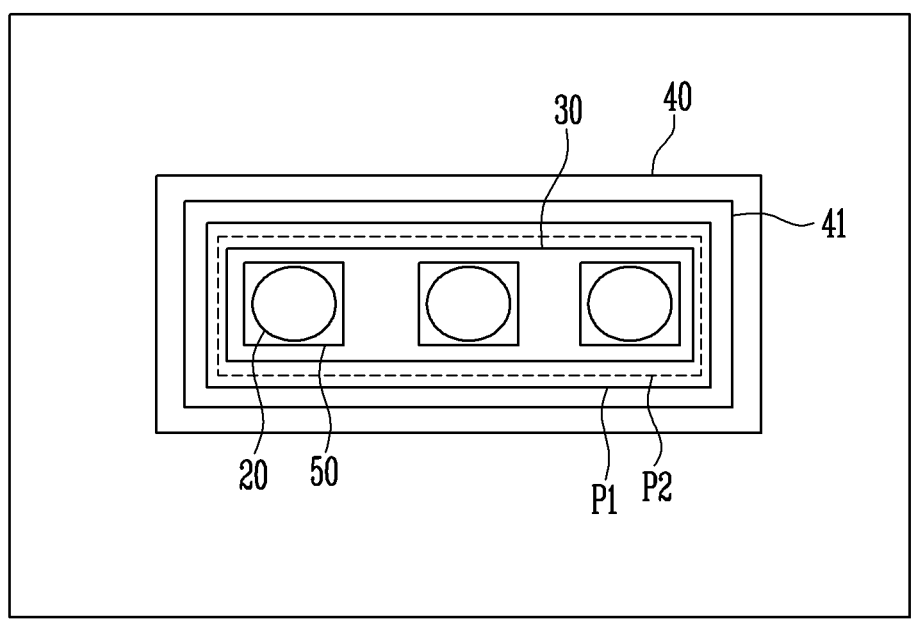
FIG. 1C is a schematic plan view of the exposure device.
Figure 2:
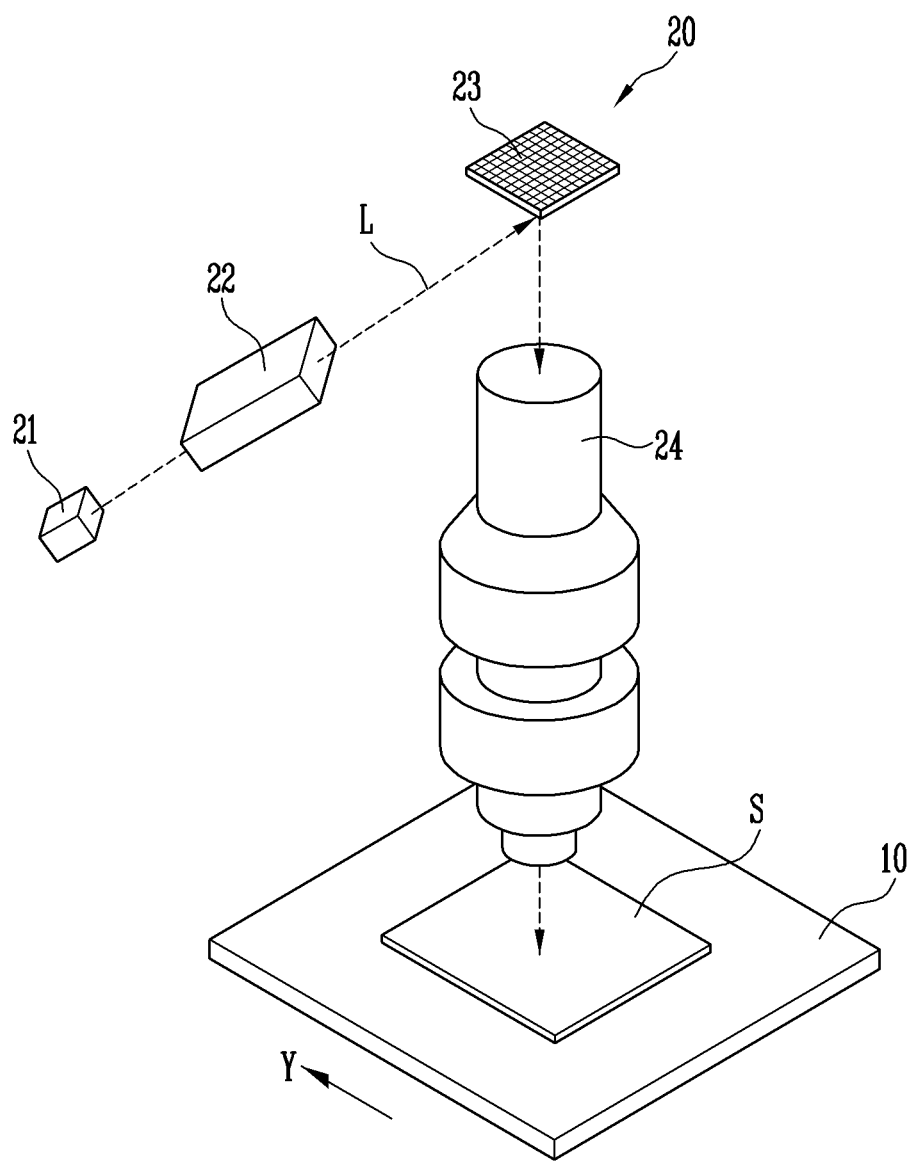
FIG. 2 is a schematic perspective view illustrating an exposure head of an exposure device in accordance with an embodiment.
Figure 3:
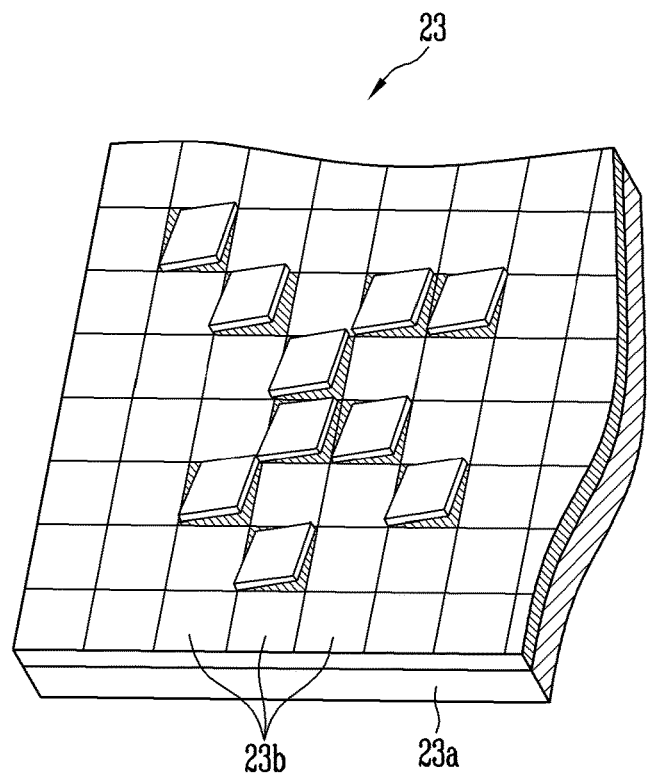
FIG. 3 is a schematic perspective view illustrating a DMD configuration of an exposure device in accordance with an embodiment.

FIG. 1A is a front schematic sectional view of an exposure device in accordance with an embodiment. FIG. 1B is a side schematic sectional view of the exposure device, and FIG. 1C is a schematic plan view of the exposure device. FIG. 2 is a schematic perspective view illustrating an exposure head of an exposure device in accordance with an embodiment. FIG. 3 is a schematic perspective view illustrating a DMD configuration of an exposure device in accordance with an embodiment.

Referring to FIGS. 1A and 1B, the exposure device 1 may include a stage 10, an exposure head 20, a support 30, a chamber 40, first protrusions P1, and second protrusions P2.

The exposure device 1 in accordance with the embodiment may be a maskless digital exposure device that may provide beams to a substrate S without providing a separate mask on the substrate S.

The stage 10 may move the substrate S in an X-axis direction, a Y-axis direction and, if necessary, a Z-axis direction. The stage 10 may be provided with guides 11 and 12 extending along the moving direction of the stage 10. The stage 10 may be reciprocated by the guides 11 and 12 in the X-axis direction that may be a sub-scan direction or in the Y-axis direction that may be a scan direction.

Furthermore, a chuck (not shown) for fixing the substrate S to the stage 10 may be provided on the stage 10, and an isolator 13 for blocking vibration from being transmitted to the stage 10 may be provided under the stage 10. A beam measuring instrument (not shown) for measuring the position of the exposure beam that may be radiated from the exposure head 20 to the substrate S may be provided on the stage 10.

The substrate S may be any object on which a pattern is to be formed, such as a film, a wafer or glass.

The exposure head 20 may be mounted (for example, fixedly mounted) to the support 30 and may radiate the exposure beam onto the substrate S, and may thus form a pattern of a desired shape on the substrate S. A single exposure head 20 or multiple exposure heads 20 may be provided on the support 30.

The stage 10 on which the substrate S may be seated may move relative to the exposure head 20. In another example, the stage 10 may be fixed and the exposure head 20 may be movable. Moreover, both the stage 10 and the exposure head 20 may be movable.

Referring to FIGS. 2 and 3, an exposure head 20 may include a light source 21 that may emit an exposure beam L, a light modulator 23 that may modulate the exposure beam L emitted from the light source 21 according to an exposure pattern (pattern information), and a projection optical system 24 that may transmit the exposure beam L modulated by the light modulator 23 to the substrate S in the form of a beam spot array. Moreover, the exposure head 20 may include an illumination optical system 22 that may correct the exposure beam L emitted from the light source 21 to a uniform intensity of illumination and transmit the beam to the light modulator 23.

The light source 21 may emit the exposure beam L provided on the substrate S, and may include a semiconductor laser or an ultraviolet lamp. However, embodiments are not limited thereto. The exposure beam L that may be emitted from the light source 21 may pass through the light modulator 23 and the projection optical system 24 and may be transmitted to the substrate S placed on the stage 10.

The light modulator 23 may include a spatial light modulator (SLM). For example, the light modulator 23 may include a Micro Electro Mechanical Systems (MEMS) type of digital micro-mirror device (DMD), a 2D Grating Light Valve (GLV), an electro-optical element using lead zirconate titanate (PLZT) that may be transparent ceramics, a Ferroelectric Liquid Crystal (FLC), or a combination thereof.

Hereinafter, for the convenience of description, the disclosure will be described using a light modulator 23 including a DMD.

Referring to FIG. 3, a DMD may be a mirror device including a memory cell 23a such as an SRAM cell, and micro mirrors 23b arranged on the memory cell 23a in a matrix type.

The DMD may vary the angle of each micro mirror 23b based on a control signal generated according to the pattern information, so that light (exposure beam) that may be to be transmitted to the substrate S may be reflected and sent to the projection optical system 24, and other lights may be sent at different angles to be blocked.

If a digital signal is recorded in the memory cell 23a of the light modulator 23 (i.e., the DMD in this embodiment), the micro mirror 23b may be inclined at an angle (e.g. 12°) about a diagonal line. The on/off control of each micro mirror 23b may be performed by a controller 50 (see, e.g., FIG. 1A). The light reflected by the micro mirror 23b which may be in an ON state may be exposed to the substrate S, and the light reflected by the micro mirror 23b which may be in an OFF state may not be transmitted to the substrate S.

Controllers 50 may be provided with each of the multiple exposure heads 20 or a single controller 50 linked with the multiple exposure heads 20 may be provided. The controller 50 may control the energy and the irradiation direction of the exposure beam L in the exposure head 20, for example, by individually controlling the on/off of the micro mirror 23b provided in the DMD.

The projection optical system 24 may include an upper lens (not shown), a micro lens array (not shown), and a lower lens (not shown). The upper lens, the micro lens array, and the lower lens may be sequentially disposed between the light modulator 23 and the stage 10.

The light reflected from the micro mirror 23b that may be turned on may increase the intensity of the light while passing through the upper lens. The light passing through the upper lens may be concentrated to a certain size while passing through the micro lens array. The light passing through the micro lens array may be radiated on the substrate S by adjusting the resolution of the light while the light may be passing through the lower lens.

The support 30 may be provided on an outer portion of an area in which the substrate S moves on the stage 10, and may have the shape of a gantry. The support 30 may support the exposure head 20 so that the exposure head 20 may be located above the substrate S.

The exposure head 20 may be mounted to the support 30 to penetrate the support 30. The exposure head 20 may be moved on the support 30 in a vertical direction (e.g., up and down relative to the support 30).

Referring to FIGS. 1A and 1B, an upper portion of the exposure head 20 is shown as being exposed above an upper portion of the support 30. However, the upper portion of the exposure head 20 may be located inside the support 30, and only a lower portion of the exposure head 20 may be exposed below a lower portion of the support 30.

The upper portion of the support 30 on which the exposure head 20 may be located may be accommodated in a first space R1 of the chamber 40 that will be described later. For example, when the upper portion of the exposure head 20 may be exposed above the upper portion of the support 30 or the upper portion of the exposure head 20 may be located inside the support 30, the upper portion of the exposure head 20 may be accommodated in the first space R1 of the chamber 40.

The chamber 40 may accommodate the stage 10, the exposure head 20, and the support 30. To be more specific, the chamber 40 may be partitioned into the first space R1 that may be at an upper position and a second space R2 that may be at a lower position. The first space R1 may be smaller in size than the second space R2.

A part of the upper portion of the support 30 may be accommodated in the first space R1. As described above, a part (e.g., upper portion) of the exposure head 20 may be located in the first space R1. The stage 10, the substrate S and the lower portion of the support 30 may be accommodated in the second space R2.

The exposure device 1 may include a first air conditioner 61 (see, e.g., FIG. 1A) that may supply air from outside the chamber 40 to the first space R1 to cool the first space R1, and a second air conditioner 62 that may supply air from outside the chamber 40 to the second space R2 to cool the second space R2.

The light modulator 23 controlled by an electrical signal may be positioned in the upper portion of the exposure head 20, and the upper portion of the exposure head 20 have may experience a higher temperature than other portions. Thus, the first space R1 in which the upper portion of the exposure head 20 may be accommodated may require more cooling than the second space R2.

A temperature of the air supplied by the first air conditioner 61 (i.e., first air) may be equal to the temperature of the air supplied by the second air conditioner 62) (i.e., second air) to prevent a temperature deviation from occurring in the chamber 40. In an embodiment, since the first space R1 may require more cooling than the second space R2, the flow rate of the first air introduced into the first space R1 may be higher than the flow rate of the second air introduced into the second space R2.

Furthermore, the air cooling efficiency in the chamber 40 can be improved, by making the size of the first space R1 smaller than the size of the second space R2.

The chamber 40 may include a partition wall 41 provided between the first space R1 and the second space R2. The partition wall 41 may protrude from an inner wall of the chamber 40. By providing the partition wall 41 between the first space R1 and the second space R2, it may be possible to perform a precise air conditioning operation and minimize influence between the first space R1 and the second space R2 during the air cooling operation.

In an embodiment, the exposure device 1 may be configured such that the stage 10, the exposure head 20 and the support 30 may be spaced apart from the chamber 40 in a contactless manner. To be more specific, the support 30 and the partition wall 41 may be spaced apart from each other. Therefore, external vibration acting on the chamber 40 may be prevented from being transmitted to the stage 10, the support 30, and the exposure head 20, thus preventing a pattern formed on the substrate S from being distorted.

As the exposure device 1 may be made in a contactless structure, a space may be created between the support 30 and the inner wall of the chamber 40. As described above, since the flow rate of the first air supplied to the first space R1 may be greater than the flow rate of the second air supplied to the second space R2, the pressure of the first space R1 may be greater than the pressure of the second space R2.

Since the first space R1 may create a positive pressure as compared to the second space R2, airflow may be formed so that air may flow from the first space R1 to the second space R2 through the space between the support 30 and the inner wall of the chamber 40.

When the air flows from the first space R1 to the second space R2 through the space, fine particles that may be present in the first space R1 may be introduced into the second space R2 in which the substrate S may be accommodated, which may deteriorate the precision of pattern formation. As the airflow may be created between the first space R1 and the second space R2, a non-uniform temperature deviation may occur in the chamber 40.

According to an embodiment, first protrusions P1 may be provided on an outer circumference of the support 30 and second protrusions P2 may be provided on the inner wall of the chamber 40. The first and second protrusions P1 and P2 may be arranged or configured to overlap each other in a plan view to mitigate the airflow from the first space R1 to the second space R2. In an embodiment, the first and second protrusions P1 and P2 may be alternately arranged to be spaced apart from each other. The protrusions P1 and P2 may mitigate the airflow from the first space R1 to the second space R2 while effectively air-conditioning the first space R1 and the second space R2.

The protrusions P1 and P2 may prevent the non-uniform temperature deviation from occurring in the chamber 40, and may prevent the fine particles that may be present in the first space R1 from flowing along the airflow into a space in which the exposure beam L may be radiated onto the substrate S, namely, the second space R2. Accordingly, the precision of the formation of the pattern on the substrate S may be improved.

Referring to FIGS. 1A to 1C, the first protrusions P1 may be provided on the outer circumference of the support 30 adjacent to the inner wall of the chamber 40. To be more specific, the first protrusions P1 may be provided along the outer circumference of the support 30 that may be surrounded by an adjacent portion of the inner wall of the chamber 40.

Referring to FIGS. 1A to 1C, the second protrusions P2 may be provided on a portion of the inner wall of the chamber 40 that surrounds the outer circumference of the support 30.

To be more specific, the second protrusions P2 may be provided along the inner wall of the chamber 40 that surrounds the outer circumference of the support 30 having the first protrusions P1. Here, the first protrusions P1 and the second protrusions P2 may be alternately arranged to be spaced apart from each other.

In an embodiment, as shown FIGS. 1A to 1C, the first protrusion P1 may be located at an uppermost position, and the second protrusion P2 may be located under the first protrusion. Subsequently, the multiple first protrusions P1 and the multiple second protrusions P2 may be alternately arranged (see, for example, FIGS. 4 to 8). In another example, the second protrusion P2 may be located at the uppermost position, and the first protrusion P1 may be located under the second protrusion. Subsequently, the multiple second protrusions P2 and the multiple first protrusions P1 may be alternately arranged.

The protrusions P1 and P2 may be respectively provided on the outer circumference of the support 30 and the inner wall of the chamber 40 through various methods. For example, the first protrusions P1 may be formed by etching the outer circumference of the support 30 and the second protrusions P2 may be formed by etching the inner wall of the chamber 40. As another example, the first protrusions P1 may be formed by attaching the first protrusions P1 to the outer circumference of the support 30 and the second protrusions P2 may be formed by attaching the second protrusions P2 to the inner wall of the chamber 40. As another example, a mold that has a shape of the protrusions P1 and P2 may be used to create the protrusions P1 and P2. However, the method of providing the first protrusions P1 on the outer circumference of the support 30 and the second protrusions P2 on the inner wall of the chamber 40 is not limited to the embodiments disclosed.

Although FIGS. 1A and 1B illustrate that two first protrusions P1 may be provided on the outer circumference of the support 30 and one second protrusion P2 may be provided on the inner wall of the chamber 40, this is for the convenience of description. Two or more first protrusions P1 may be provided on the outer circumference of the support 30, and two or more second protrusions P2 may be provided on the inner wall of the chamber 40.

The partition wall 41 may protrude from the inner wall of the chamber 40 towards the support 30. To be more specific, the partition wall 41 may protrude from the inner wall of the chamber 40 to surround the outer circumference of the support 30 having the first protrusions P1. For example, the partition wall 41 may be provided on the inner wall of the chamber 40 that may be closest to the support 30.

The second protrusions P2 may be provided on a surface of the partition wall 41 facing the outer circumference of the support 30 having the first protrusions P1, thus effectively mitigating the airflow between the first space R1 and the second space R2.

By mitigating the airflow between the first space R1 and the second space R2, fine particles may be suppressed from flowing from the first space R1 to the second space R2, thus preventing the pattern formed on the substrate S from being distorted.

Figure 4:
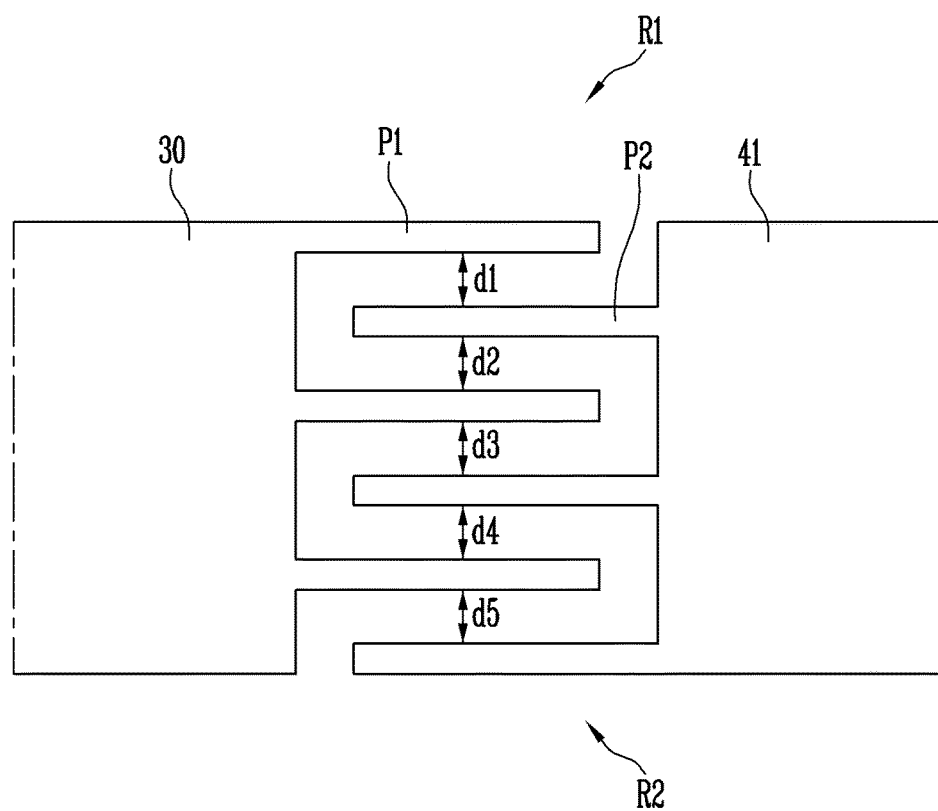
FIG. 4 is a schematic sectional view illustrating first protrusions and second protrusions in accordance with an embodiment.

FIG. 4 is a schematic sectional view illustrating first protrusions and second protrusions in accordance with an embodiment. Referring to FIG. 4, the protrusions P1 and P2 may be respectively provided on a surface of the support 30 and a surface of the partition wall 41 that face each other.

Since the first protrusions P1 provided on the support 30 and the second protrusions P2 provided on the partition wall 41 may be spaced apart from each other, the exposure device 1 may implement a contactless structure.

As the first protrusions P1 and the second protrusions P2 may be alternately arranged, pressure may be lowered while air flows from the first space R1 to the second space R2, so that the airflow may be reduced between the first space R1 and the second space R2.

Referring to FIG. 4, distances between the first protrusions P1 and the second protrusions P2 may be equal to each other in a direction (hereinafter, stage direction) from the first space R1 towards the second space R2.

To be more specific, a distance d1 between the first protrusion P1 in a first place and the second protrusion P2 in a first place, a distance d2 between the second protrusion P2 in the first place and the first protrusion P1 in a second place, and a distance d3 between the first protrusion P1 in the second place and the second protrusion P2 in the second place in the stage direction may be equal to each other. Moreover, spacing distances d4 and d5 between the first protrusions P1 and the second protrusions P2 in successive places may also have the same length as the aforementioned spacing distances d1 to d3.

Figure 5A:
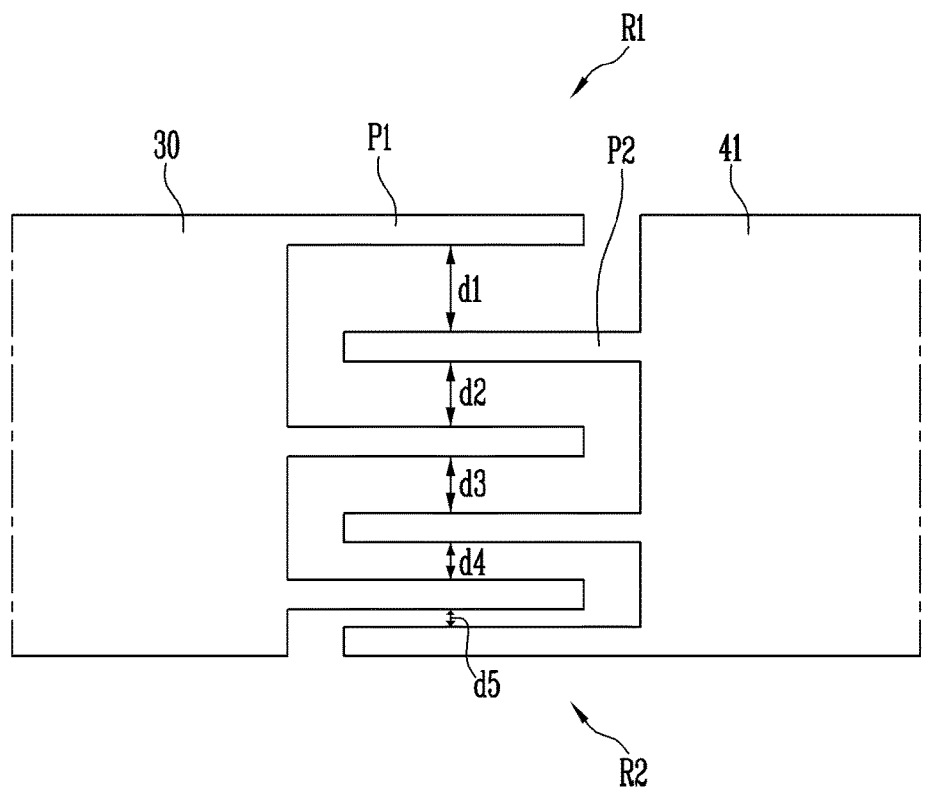
FIGS. 5A and 5B are schematic sectional views illustrating first protrusions and second protrusions in accordance with another embodiment.
Figure 5B:
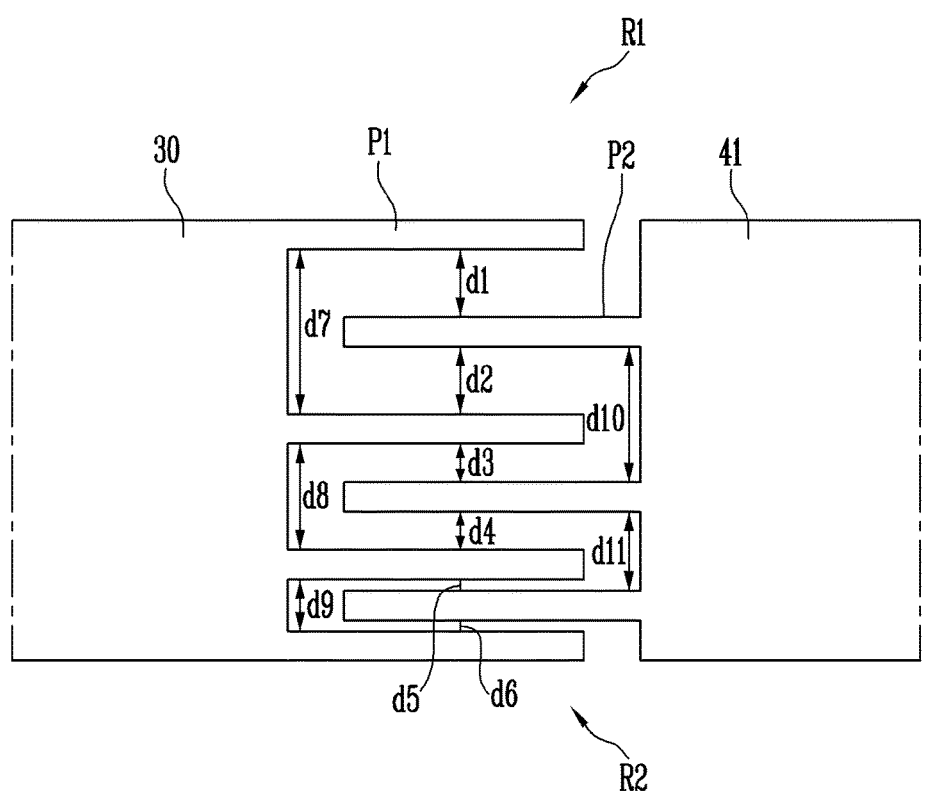
Figure 6:
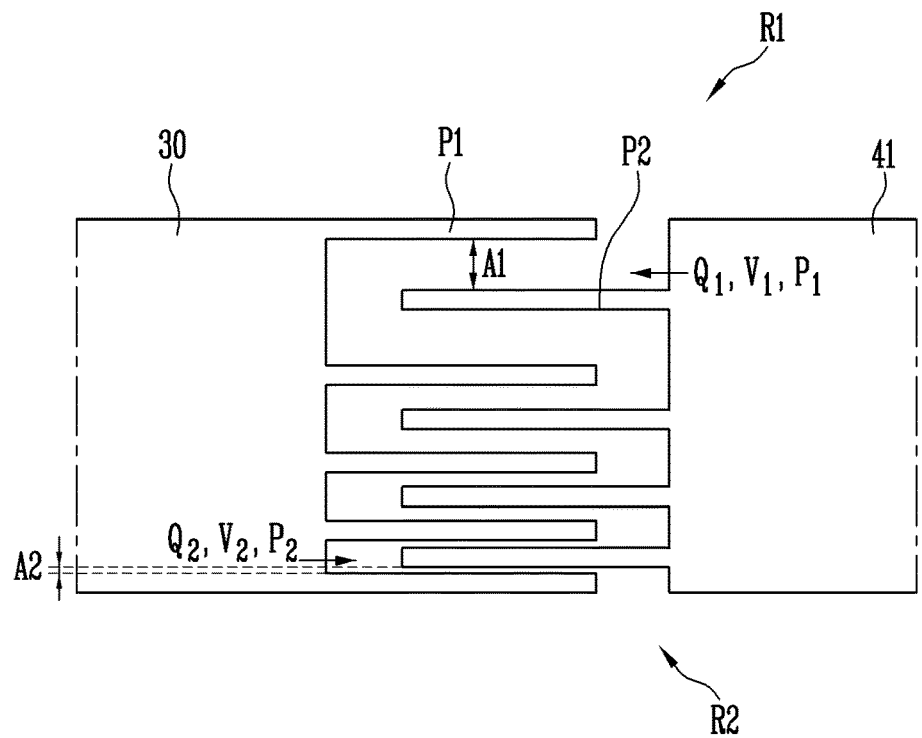
FIG. 6 is a schematic diagram illustrating a state of airflow flowing through the first protrusions and the second protrusions in accordance with an embodiment.

FIGS. 5A and 5B are schematic sectional views illustrating first protrusions and second protrusions in accordance with another embodiment, and FIG. 6 is a schematic diagram illustrating a state of airflow flowing through the first protrusions and the second protrusions in accordance with another embodiment.

Referring to FIGS. 5A and 5B, spacing distances between the first protrusions P1 and the second protrusions P2 may be reduced in the direction (hereinafter, stage direction) from the first space R1 towards the second space R2. By reducing the spacing distances between the first protrusions P1 and the second protrusions P2 in the stage direction, airflow between the first space R1 and the second space R2 may be more effectively mitigated.

Referring to FIG. 6, a flow rate of the air introduced into an initial end of the protrusions P1 and P2 in the first space R1 may be $Q_1$, the flow cross-sectional area may be $A_1$, and the flow velocity may be $V_1$. The flow rate of the air flowing from ends of the protrusions P1 and P2 to the second space R2 may be $Q_2$, the flow cross-sectional area may be $A_2$, and the flow velocity may be $V_2$.

Here, $Q_1$, $A_1$, $V_1$ and $Q_2$, $A_2$, $V_2$ satisfy the following equation 1.

[Equation 1]

$$Q_1 = Q_2 \quad 1)$$

$$A_1 \cdot V_1 = A_2 \cdot V_2 \quad 2)$$

Referring to FIG. 6, since $A_1$ may be larger than $A_2$, $V_1$ may be smaller than $V_2$.

Furthermore, in the following Bernoulli's equation, it can be concluded that $P_2$ may be smaller than $P_1$ because $V_1$ may be smaller than $V_2$ as described above.

[Bernoulli's Equation]

$$P_1 + \rho g h + \tfrac{1}{2} \rho V_1^2 = P_2 + \rho g h + \tfrac{1}{2} \rho V_2^2$$

While the air in the first space R1 passes between the protrusions P1 and P2, pressure decreases as the flow velocity increases. For example, a pressure drop occurs when air flows from the first space R1 to the second space R2, so that a pressure difference between the first space R1 and the second space R2 may be reduced. Thus, the airflow can be further slowed down due to the pressure difference between the first space R1 and the second space R2.

In the stage direction, spacing distances between the first protrusions P1 and the second protrusions P2 may be gradually reduced by a multiplier of about 0.7 to about 0.9.

Referring to FIG. 5A, a ratio of the distance d1 between the first protrusion P1 in the first place and the second protrusion P2 in the first place in the stage direction to the distance d2 between the second protrusion P2 in the first place and the first protrusion P1 in the second place may be about 1:0.7 to about 1:0.9. Furthermore, a ratio of the distance d2 to the distance d3 between the first protrusion P1 in the second place and the second protrusion in the second place may be about 1:0.7 to about 1:0.9. Moreover, the spacing distances d4 and d5 between the first protrusions P1 and the second protrusions P2 in successive places may also be reduced in the same proportion as described above.

By adjusting a ratio in which the distances between the first protrusions P1 and the second protrusions P2 in the stage direction are reduced according to the above-mentioned range, the flow velocity of the air passing between the protrusions P1 and P2 may be increased, so that the pressure of the air discharged to the second space R2 may be further decreased. In other words, the airflow between the first space R1 and the second space R2 may be effectively mitigated by inducing a pressure drop.

In the stage direction, a distance between the first protrusions P1 and a distance between the second protrusions P2 may be gradually reduced by a multiplier of about 0.7 to about 0.9.

Referring to FIG. 5B, a ratio of a distance d7 between the first protrusion P1 in the first place and the first protrusion P1 in the second place in the stage direction to a distance d8 between the first protrusion P1 in the second place and the first protrusion P1 in a third place may be about 1:0.7 to about 1:0.9. A ratio of the distance d8 between the first protrusion P1 in the second place and the first protrusion P1 in the third place to a distance d9 between the first protrusion P1 in the third place and the first protrusion P1 in a fourth place may be about 1:0.7 to about 1:0.9.

Furthermore, a ratio of a distance d10 between the second protrusion P2 in the first place and the second protrusion P2 in the second place to a distance d11 between the second protrusion P2 in the second place and the second protrusion P2 in the third place may be about 1:0.7 to about 1:0.9.

Thus, the distance d1 between the first protrusion P1 in the first place and the second protrusion P2 in the first place may be equal to the distance d2 between the second protrusion P2 in the first place and the first protrusion P1 in the second place. Further, the distance d3 between the first protrusion P1 in the second place and the second protrusion P2 in the second place may be equal to the distance d4 between the second protrusion in the second place and the first protrusion P1 in the third place. Moreover, the distances of the spacing distances d5 and d6 may also be equal to each other.

If the distance between the first protrusions P1 and the distance between the second protrusions P2 in the stage direction may be within the above-mentioned range, the airflow may be slowed down by effectively inducing the pressure drop when air flows from the first space R1 to the second space R2.

Figure 7:
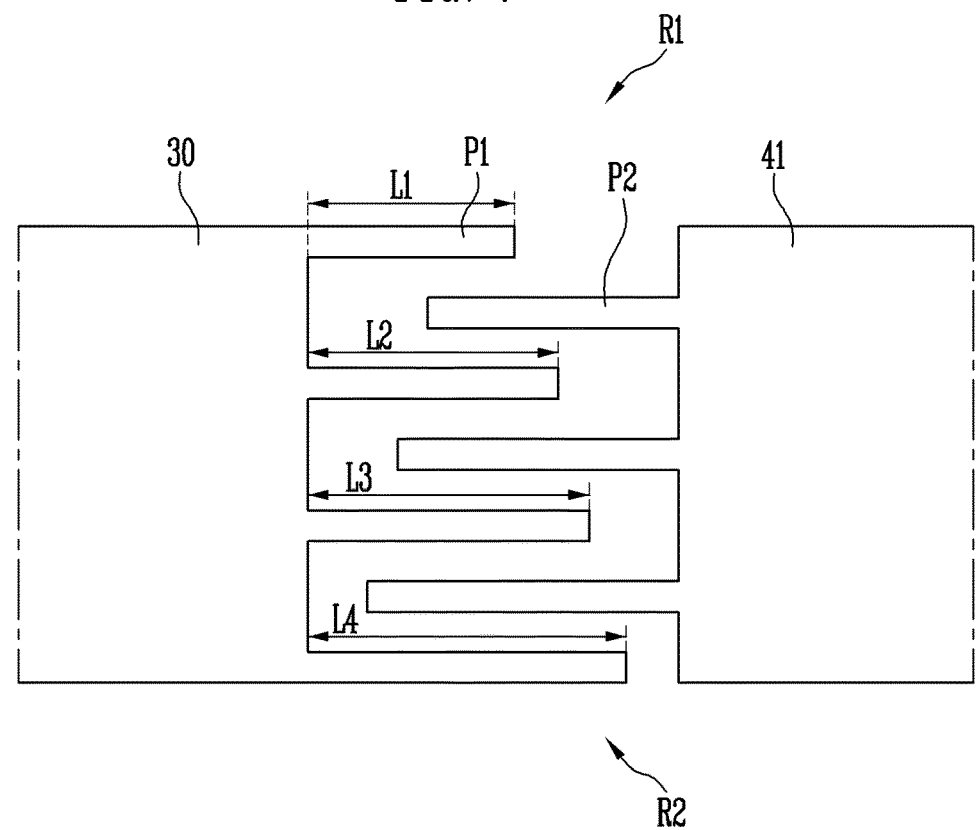
FIG. 7 is a schematic sectional view illustrating first protrusions and second protrusions in accordance with another embodiment.

FIG. 7 is a schematic sectional view illustrating first protrusions and second protrusions in accordance with an embodiment.

Referring to FIG. 7, the lengths of the first protrusions P1 and the second protrusions P2 can be increased protrusion to protrusion in the stage direction. In an embodiment, the lengths of the first protrusions P1 may be gradually increased by a multiplier of about 1.1 to about 1.3 in the stage direction. In the same manner, the lengths of the second protrusions P2 may be gradually increased by a multiplier of about 1.1 to about 1.3 in the stage direction.

As schematically illustrated in FIG. 7, a ratio of the length L1 of the first protrusion P1 in the first place, protruding from a surface of the support 30, to the length L2 of the first protrusion P1 in the second place in the stage direction may be about 1:1.1 to about 1:1.3. Furthermore, a ratio of the length L2 of the first protrusion P1 in the second place to the length L3 of the first protrusion P1 in the third place may be about 1:1.1 to about 1:1.3. The length of the second protrusions P2 may also be increased at the same rate as the length of the above-described first protrusions P1.

By adjusting the rate at which the lengths of the first protrusions P1 and the second protrusions P2 in the stage direction increase within the above-described range, a contact section between the air flowing from the first space R1 to the second space R2 and the protrusions may increase, thus allowing the pressure drop to be easily induced.

FIG. 8 is a schematic sectional view illustrating first protrusions and second protrusions in accordance with an embodiment.

Referring to FIG. 8, the widths of the first protrusions P1 and the second protrusions P2 in the stage direction may be increased protrusion to protrusion in the stage direction. In an embodiment, the widths of the first protrusions P1 in the stage direction may be gradually increased by a multiplier of about 1.1 to about 1.3. In the same manner, the widths of the second protrusions P2 may be gradually increased in the stage direction by a multiplier of about 1.1 to about 1.3.

Referring to FIG. 8, a ratio of a width w1 of the first protrusion P1 in the first place to a width w2 of the first protrusion P1 in the second place in the stage direction may be about 1:1.1 to about 1:1.3. A ratio of the width w2 of the first protrusion P1 in the second place to the width w3 of the first protrusion P1 in the third place may be about 1:1.1 to about 1:1.3. The width of the second protrusions P2 may also be increased at the same rate as the width of the above-described first protrusions P1.

If the widths of the protrusions P1 and P2 adjacent to each other in the stage direction may be within the above-described range, a pressure drop may be easily induced similarly to reducing the spacing distances of the protrusions P1 and P2.

According to an embodiment, protrusions can be alternately provided between an outer circumference of a support and an inner wall of a chamber to be spaced apart from each other, thus effectively air-conditioning an interior of a chamber and simultaneously suppressing airflow from being formed in the chamber.

The foregoing detailed descriptions may illustrate and describe the embodiments. The foregoing descriptions merely illustrate and describe embodiments. As described above, the disclosure may be used in various different combinations, modifications and environments, and may be changed or modified within the scope of the inventive concept disclosed in this specification, the scope equivalent to the above-described description and/or the scope of technology or knowledge of the art. Therefore, the description is not intended to limit the disclosure to the form disclosed herein. Also, it is intended that the appended claims be construed to include alternative embodiments.

What is claimed is:

1. An exposure device, comprising:
    an exposure head that radiates an exposure beam onto a substrate on a stage of the exposure device;
    a support provided on the stage to support the exposure head;
    a chamber that accommodates the stage, the exposure head, and the support;
    first protrusions disposed on an outer circumference of the support adjacent to an inner wall of the chamber; and
    second protrusions disposed on the inner wall of the chamber surrounding the outer circumference of the support,
    wherein the first and second protrusions are disposed to overlap each other in a plan view.

2. The exposure device of claim 1, wherein the first and second protrusions are arranged alternately with each other and spaced apart from each other.

3. The exposure device of claim 1, wherein the chamber comprises:
    a first space in which a part of the exposure head is accommodated; and
    a second space in which the stage is accommodated.

4. The exposure device of claim 3, further comprising a partition wall provided between the first space and the second space, and protruding from the inner wall of the chamber,
    wherein the partition wall is spaced apart from the support.

5. The exposure device of claim 4, wherein the second protrusions are provided on a surface of the partition wall facing the support.

6. The exposure device of claim 3, further comprising:
    a first air conditioner that supplies first air to the first space of the chamber from outside the chamber; and
    a second air conditioner that supplies second air to the second space of the chamber from outside the chamber.

7. The exposure device of claim 6, wherein a flow rate of the first air supplied to the first space of the chamber is greater than a flow rate of the second air supplied to the second space of the chamber.

8. The exposure device of claim 3, wherein spacing distances between the first protrusions and the second protrusions are equal to each other in a direction from the first space towards the second space.

9. The exposure device of claim 3, wherein spacing distances between the first protrusions and the second protrusions are reduced in a direction from the first space towards the second space.

10. The exposure device of claim 3, wherein spacing distances between the first protrusions and the second protrusions are reduced by a multiplier of about 0.7 to about 0.9 in a direction from the first space towards the second space.

11. The exposure device of claim 3, wherein a spacing distance between the first protrusions and a spacing distance between the second protrusions are reduced by a multiplier of about 0.7 to about 0.9 in a direction from the first space towards the second space.

12. The exposure device of claim 3, wherein lengths of the first protrusions and the second protrusions increase in a direction from the first space towards the second space.

13. The exposure device of claim 3, wherein lengths of the first protrusions and the second protrusions gradually increase by a multiplier of about 1.1 to about 1.3 in a direction from the first space towards the second space.

14. The exposure device of claim 3, wherein widths of the first protrusions and the second protrusions increase in a direction from the first space towards the second space.

15. The exposure device of claim 1, wherein the exposure head comprises:
   a light source that emits an exposure beam;
   a light modulator that modulates the exposure beam according to an exposure pattern; and
   a projection optical system that transmits the modulated exposure beam to the substrate in a form of a beam spot array.

16. An exposure device, comprising:
   a chamber including a first space and a second space;
   an exposure head that radiates an exposure beam onto a substrate, the exposure head at least partially disposed in the first space;
   a stage disposed in the second space to seat the substrate;
   a support disposed in the chamber to support the exposure head;
   first protrusions disposed on an outer side of the support; and
   second protrusions disposed on an inner side of the chamber,
   wherein the first and second protrusions are disposed to overlap each other in a plan view.

17. The exposure device of claim 16, wherein the first protrusions and the second protrusions are arranged alternately with each other.

18. The exposure device of claim 16, wherein
   the chamber includes a partition wall between the first space and the second space,
   the partition wall protrudes from the inner side of the chamber, and
   the second protrusions are disposed on a surface of the partition wall.

* * * * *